United States Patent
Rolfson

(10) Patent No.: US 6,486,074 B1
(45) Date of Patent: Nov. 26, 2002

(54) METHODS OF MASKING AND ETCHING A SEMICONDUCTOR SUBSTRATE, AND ION IMPLANT LITHOGRAPHY METHODS OF PROCESSING A SEMICONDUCTOR SUBSTRATE

(75) Inventor: J. Brett Rolfson, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/614,359

(22) Filed: Jul. 12, 2000

(51) Int. Cl.$^7$ .............................................. H01L 21/302
(52) U.S. Cl. ......................... 438/725; 430/5; 438/704; 438/705; 438/734; 438/746; 438/750
(58) Field of Search ............................ 430/5; 438/725, 438/704, 705, 734, 746, 750; 216/87, 62, 57, 48, 41

(56) References Cited

U.S. PATENT DOCUMENTS

| | | | | |
|---|---|---|---|---|
| 4,377,437 A | * | 3/1983 | Taylor et al. ............... | 156/628 |
| 5,853,925 A | | 12/1998 | Huh | |
| 6,042,996 A | * | 3/2000 | Lin et al. .................... | 430/313 |

FOREIGN PATENT DOCUMENTS

| | | | |
|---|---|---|---|
| JP | 61-177720 | * | 8/1961 |
| JP | 59-053842 | * | 3/1984 |

OTHER PUBLICATIONS

"The Range of Light Ions In Polymeric Resist", Adesida et. al. (1984); J. Appl. Phys. 56(6), pp. 1801–1807.*
"A Review of Ion Projection Lithography", Melngailis et. al.; J. Vac. Sci. Tech. B (1998); 16(3); pp. 927–957.*
U.S. patent application Ser. No. 09/444280, Reinberg, pending.

* cited by examiner

Primary Examiner—George Goudreau
(74) Attorney, Agent, or Firm—Wells St. John P.S.

(57) ABSTRACT

A method of masking and etching a semiconductor substrate includes forming a layer to be etched over a semiconductor substrate. An imaging layer is formed over the layer to be etched. Selected regions of the imaging layer are removed to leave a pattern of openings extending only partially into the imaging layer. After the removing, the layer to be etched is etched using the imaging layer as an etch mask. In one implementation, an ion implant lithography method of processing a semiconductor includes forming a layer to be etched over a semiconductor substrate. An imaging layer of a selected thickness is formed over the layer to be etched. Selected regions of the imaging layer are ion implanted to change solvent solubility of implanted regions versus non-implanted regions of the imaging layer, with the selected regions not extending entirely through the imaging layer thickness. The ion implanted regions of the imaging layer are removed to leave a pattern of openings extending only partially into the imaging layer. After the removing, the layer to be etched is etched using the imaging layer as an etch mask.

12 Claims, 3 Drawing Sheets

METHODS OF MASKING AND ETCHING A SEMICONDUCTOR SUBSTRATE, AND ION IMPLANT LITHOGRAPHY METHODS OF PROCESSING A SEMICONDUCTOR SUBSTRATE

TECHNICAL FIELD

This invention relates to methods of masking and etching semiconductor substrates, and to ion implant lithography methods of processing semiconductor substrates.

BACKGROUND OF THE INVENTION

Integrated circuitry fabrication typically involves lithographic processing to transfer patterns formed in an imaging layer to underlying substrate material which will form part of the finished circuitry. For example, an imaging layer such as conventional photoresist material is provided over a layer to be patterned by etching. The photoresist layer is then masked or otherwise processed such that selected regions of the imaging layer extending entirely therethrough are exposed to suitable conditions which impact the solvent solubility of the exposed regions versus the unexposed regions. For example, the selected regions of the photoresist can be exposed to actinic energy, ion implantation, or yet-to-be-developed processes. The imaging layer is then typically solvent processed to remove one or the other of the processed or the non-processed regions, thereby forming the imaging layer to have mask openings extending entirely therethrough to the underlying layer to be patterned. The substrate is then typically subjected to a suitable etching chemistry which is selected to etch the underlying layer or layers and not the imaging layer, thereby transferring the imaging pattern to the underlying circuitry layer or layers.

One type of masking or imaging layer processing comprising ion beam lithography. Here, suitable ions such $H^+$ or $He^+$ are implanted into selected regions of a photoresist or other imaging layer. The implant species and energy are selected such that the implanting occurs entirely through the imaging layer and slightly into the underlying layer to be etched to ensure the complete transformation of the implanted regions entirely through the imaging layer. Subsequent wet solvent processing is conducted which completely removes selected portions of the imaging layer forming openings entirely therethrough to the underlying layer to be etched.

Integrated circuitry fabrication continues to strive to produce denser and denser circuitry and thereby smaller and smaller individual components. This has typically been accompanied by an increase of the heights of the masking features in the imaging layer as compared their widths, something referred to as "aspect ratio". Unfortunately, this can result in a comparatively small degree of surface area for adhesion of the masking layer to the underlying layer as compared to its height at the conclusion of patterning. This can lead to toppling or displacement of the individual masking blocks by the solvent processing and cleaning processes. If the individual masking blocks become displaced or topple onto one another, the underlying layer is not properly etched to produce the desired circuitry, typically leading to fatal flaws therein.

It would be desirable to overcome this adverse processing phenomenon.

SUMMARY

The invention includes methods of masking and etching semiconductor substrates, and to ion implant lithography methods of processing semiconductor substrates. In one implementation, a method of masking and etching a semiconductor substrate includes forming a layer to be etched over a semiconductor substrate. An imaging layer is formed over the layer to be etched. Selected regions of the imaging layer are removed to leave a pattern of openings extending only partially into the imaging layer. After the removing, the layer to be etched is etched using the imaging layer as an etch mask.

In one implementation, an ion implant lithography method of processing a semiconductor includes forming a layer to be etched over a semiconductor substrate. An imaging layer of a selected thickness is formed over the layer to be etched. Selected regions of the imaging layer are ion implanted to change solvent solubility of implanted regions versus non-implanted regions of the imaging layer, with the selected regions not extending entirely through the imaging layer thickness. The ion implanted regions of the imaging layer are removed to leave a pattern of openings extending only partially into the imaging layer. After the removing, the layer to be etched is etched using the imaging layer as an etch mask.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts"(Article 1, Section 8).

In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. Further in the context of this document, the term "layer" encompasses both the singular and the plural. Further in the context of this document, the term "imaging layer" defines a layer which is capable of having its solvent solubility changed by exposure to a suitable energy such as, by way of examples only, actinic energy or the act of ion bombardment.

Figure 1:
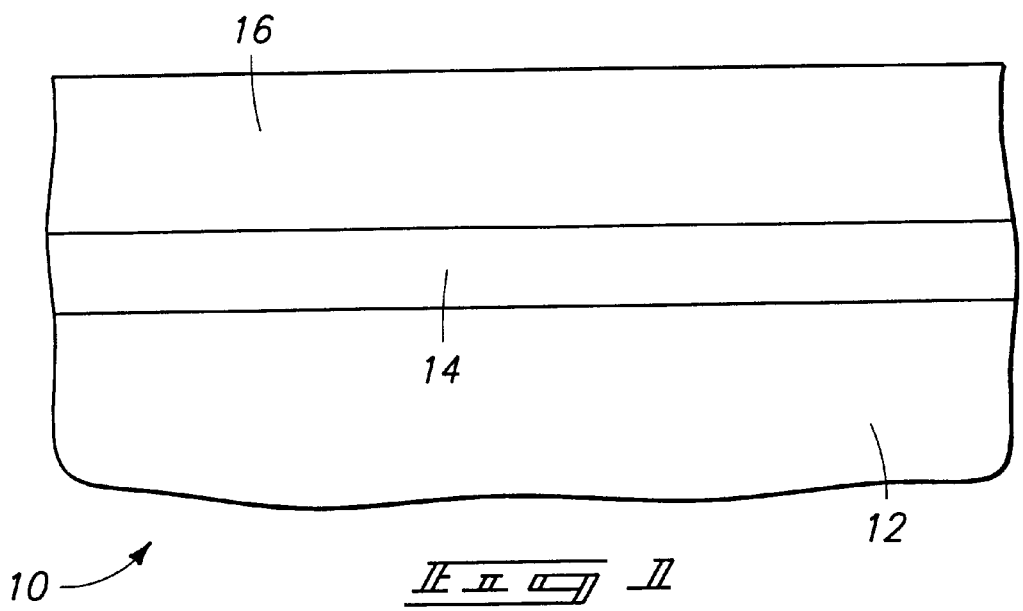
FIG. 1 is a diagrammatic sectional view of a semiconductor wafer fragment at one processing step in accordance with an aspect of the invention.

Referring to FIG. 1, an example semiconductor wafer fragment to be processed is indicated generally with reference numeral 10. Such comprises a bulk monocrystalline silicon substrate 12 having a layer 14 to be etched formed thereover. Layer 14 might constitute any conventional or yet-to-be-developed conductive, semiconductive, insulating or other layer. An imaging layer 16 is formed over the layer to be etched 14. An exemplary thickness for layer 16 is 10,000 Angstroms. Imaging layer 16 preferably consists essentially of a single, homogenous layer. A preferred imaging layer material is organic, with any organic photoresist being a more specific example. Selected regions of the imaging layer will be removed to leave a pattern of openings extending only partially into the imaging layer.

Figure 2:
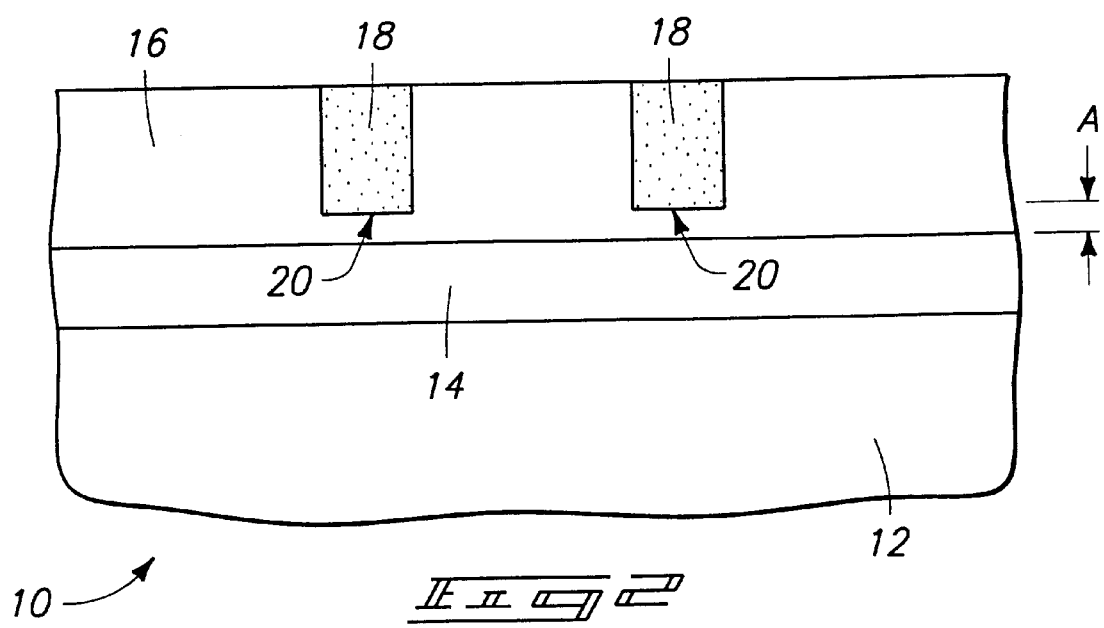
FIG. 2 is a view of the FIG. 1 wafer fragment at a processing step subsequent to that depicted by FIG. 1.

For example, and with reference with FIG. 2, selected regions 18 are ion implanted to change the solvent solubility of such regions versus the surrounding non-implanted regions of imaging layer 16. In one implementation, implanted regions are formed to have innermost peak implant concentrations 20 which are spaced elevationally outward from the layer to be etched 14 by a distance depicted as dimension "A". A preferred length for dimension "A" is from about 50 Angstroms to about 5000 Angstroms, with from about 200 Angstroms to about 2000 Angstroms being more preferred, and from about 400 Angstroms to about 800 Angstroms being even more preferred. In another considered implementation, selected regions 18 are formed to not extend entirely through the thickness of imaging layer 16, thus forming innermost bases at location 20 independent of innermost peak implant concentration(s). Exemplary and preferred ion implant components include hydrogen ions and helium ions. A specific example, and by way of example only, where layer 16 comprises an organic photoresist 10,000 Angstroms thick and dimension "A" comprises a distance of from 200 Angstroms to 2000 Angstroms, an example energy and dose for hydrogen ion implantation is 70 keV and 1.4 micro-C/$cm_2$, respectively, for OiR 897i resist, available from Arch Chemicals of Norwalk, Conn.

Figure 3:
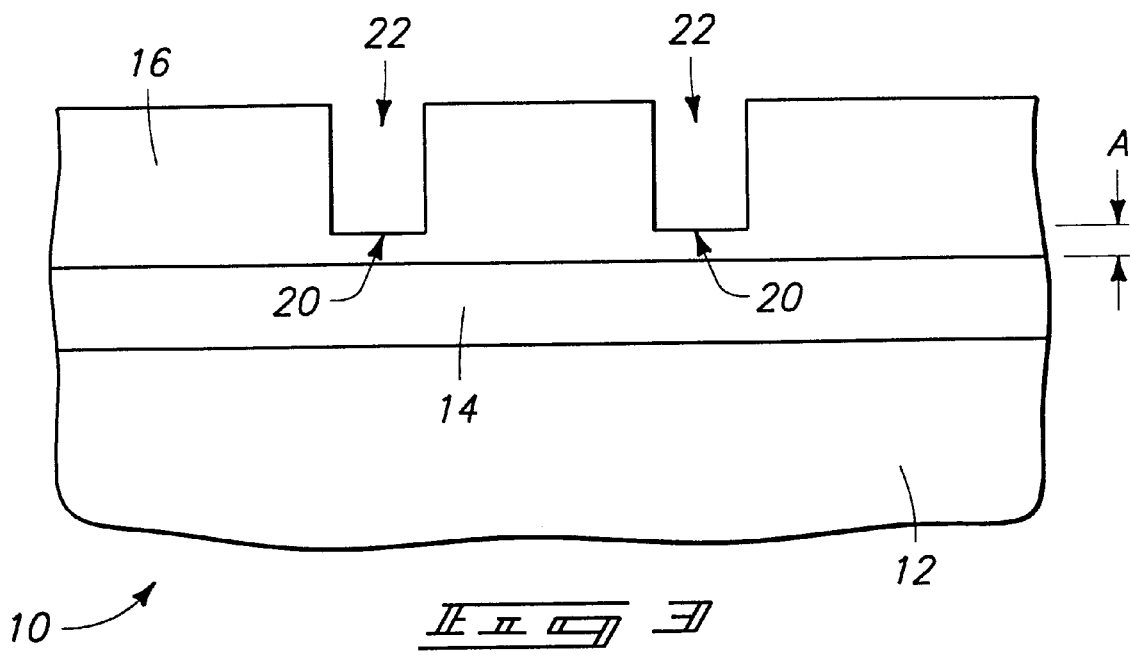
FIG. 3 is a view of the FIG. 1 wafer fragment at a processing step subsequent to that depicted by FIG. 2.

Referring to FIG. 3, ion implanted regions 18 (FIG. 2) are removed to leave a pattern of openings 22 extending only partially into imaging layer 16. Typical and preferred processing in conjunction with organic photoresist or other imaging layer materials will include wet solvent processing and etching. For example, and by way of example only, where layer 16 comprises OiR 897i photoresist, a typical processing sequence after formation of regions 18 to achieve the FIG. 3 construction includes a post-exposure bake of from about 100° C. to about 120° C. for from about 60 seconds to about 120 seconds, followed by development of the photoresist using 0.26N TMAH (tetramethyl ammonium hydroxide) in deionized water. Typically, the wafer is subjected to this solvent mixture for a period of about 60 seconds to about 90 seconds, followed by a deionized water rinse. The wafer is then suitably dried. After such removing, the layer 14 to be etched is ultimately etched using imaging layer 16 as an etch mask.

Figure 4:
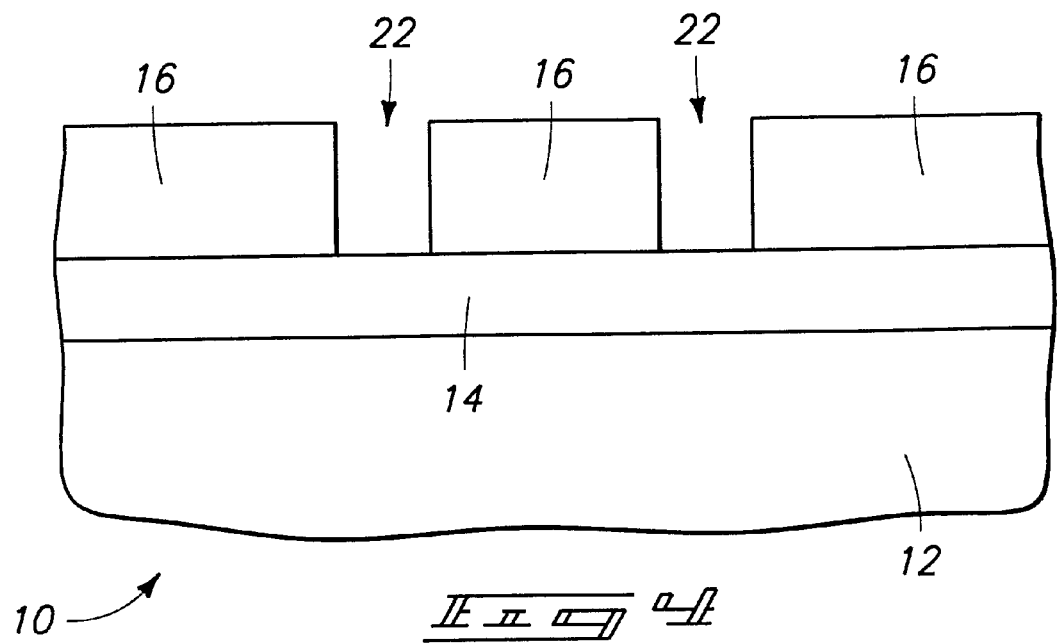
FIG. 4 is a view of the FIG. 1 wafer fragment at a processing step subsequent to that depicted by FIG. 3.

For example in a first preferred embodiment, and referring to FIG. 4, imaging layer 16 is blanket etched using an etch chemistry that is substantially selective to layer-to-be-etched 14 to outwardly expose layer 14 through mask openings 22. In the context of this document, "substantially selective" means utilizing a chemistry achieving at least a 2:1 removal rate. Where, for example, layer 16 comprises organic photoresist and layer 14 comprises polysilicon, an exemplary etch chemistry includes conventional blanket etching utilizing a timed $O_2$ plasma. A goal in such processing would be a suitably timed etch to achieve only sufficient removal of imaging layer 16 (selective to layer 14) to achieve exposure of layer 14, leaving enough of layer 16 behind to serve as an etching mask for a subsequent underlying etch of layer 14 using a different etch chemistry.

Figure 5:
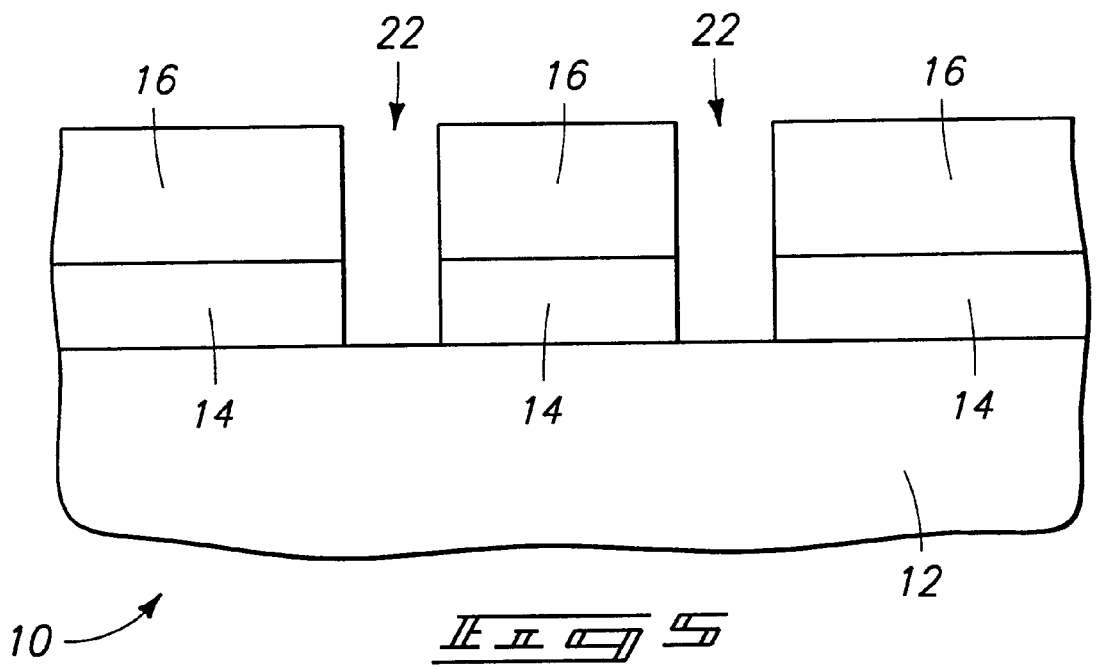
FIG. 5 is a view of the FIG. 1 wafer fragment at a processing step subsequent to that depicted by FIG. 4.

FIG. 5 depicts subsequent etching of layer 14 through mask openings 22 of FIG. 4 using an etch chemistry that is substantially selective to imaging layer 16. Utilizing the above examples, a suitable dry etch chemistry for such etch includes a chemistry of chlorine gas and HBr, or other suitable halogen-containing species known in the art.

Figure 6:
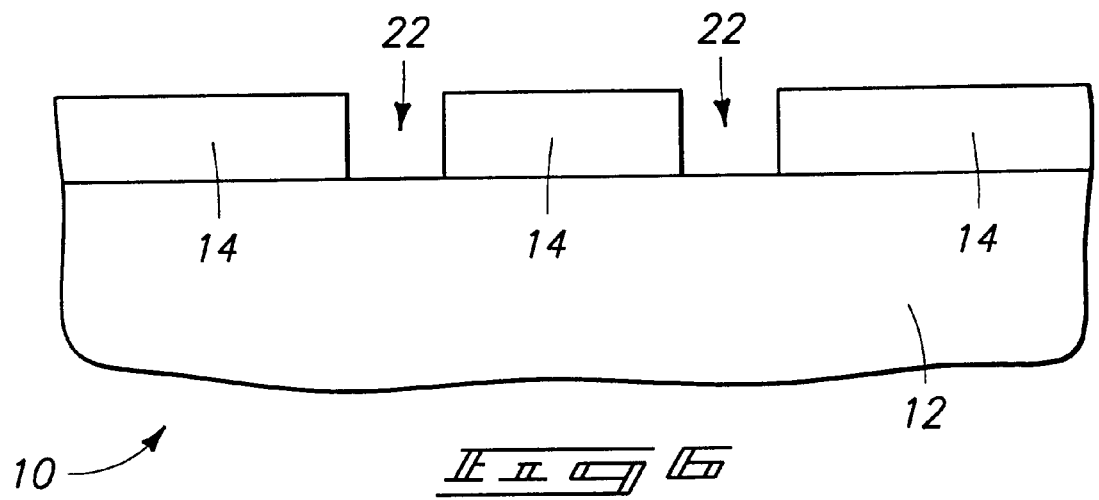
FIG. 6 is a view of the FIG. 1 wafer fragment at a processing step subsequent to that depicted by FIG. 5.

FIG. 6 illustrates ultimate removal of imaging layer 16.

In but one example alternate embodiment, the depicted processing might also occur by blanket etching the imaging layer and the layer to be etched using an etch chemistry that is substantially selective to the imaging layer. Etching selectivity can be selected which is not so great to entirely prevent the removal of layer 16, yet utilizing a chemistry which is largely selective thereto. Utilizing the above materials and the etching chemistry utilized to produce the FIG. 5 construction, a selectivity to the imaging layer is about 3:1. With such exemplary processing, the blanket etching will first etch through bases 20 of openings 22 to expose layer 14 to be etched, with continued etching occurring into layer 14 largely selective to layer 16 to produce the FIG. 5 construction.

The invention was primarily motivated in overcoming concerns associated with ion lithographic processing. However, the invention is also seen to be applicable to other energy processing of imaging layers, such as using photo-processing with actinic energy. For example, suitable energy, time, filtering or structural patterning relative to a photoresist layer could be conducted to achieve the FIG. 2 or other construction. By way of example only, exemplary processing whereby less than an entirety of the thickness of a photoresist layer is processed is described with reference to our co-pending U.S. patent application Ser. No. 09/444,280, filed on Nov. 19, 1999, entitled "Microelectronic Device Fabricating Method, Integrated Circuit, and Intermediate Construction" listing Alan R. Reinberg as an inventor, and which is now U.S. Pat. No. 6,232,292 B1, and which is hereby fully incorporated by reference.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of masking and etching a semiconductor substrate comprising:

forming a layer to be etched over a semiconductor substrate;

forming an imaging layer over the layer to be etched;

removing selected regions of the imaging layer to leave a pattern of openings extending only partially into the imaging layer, the partially extending openings thereby respectively having a base within the imaging layer;

after the removing, etching the layer to be etched using the imaging layer as an etch mask by first blanket etching the imaging layer and the layer to be etched using an etch chemistry that is substantially selective to the imaging layer, the blanket etching first etching through the respective opening bases effective to expose the layer to be etched and then etching into the layer to be etched substantially selectively to the imaging layer; and wherein the removing comprises exposing the selected regions to actinic energy to change solvent solubility of the exposed regions versus the non-exposed regions of the imaging layer.

2. The method of claim 1 wherein the imaging layer is organic.

3. The method of claim 1 wherein the imaging layer comprises organic photoresist.

4. The method of claim 1 wherein the imaging layer consists essentially of organic photoresist.

5. The method of claim 1 wherein the imaging layer consists essentially of a single, homogeneous layer.

6. An ion implant lithography method of processing a semiconductor substrate comprising:

forming a layer to be etched over a semiconductor substrate;

forming an imaging layer of a selected thickness over the layer to be etched;

ion implanting selected regions of the imaging layer to change solvent solubility of implanted regions versus non-implanted regions of the imaging layer, said selected regions not extending entirely through the imaging layer thickness;

removing the ion implanted regions of the imaging layer to leave a pattern of openings extending only partially into the imaging layer, the partially extending openings thereby respectively having a base within the imaging layer; and after the removing, extending the partially formed imaging layer openings to the layer to be etched and etching the layer to be etched through the extended openings using the imaging layer as an etch mask by first blanket etching the imaging layer and the layer to be etched using an etch chemistry that is substantially selective to the imaging layer, the blanket etching first etching through the respective opening bases effective to expose the layer to be etched and then etching into the layer to be etched substantially selectively to the imaging layer.

7. The method of claim 6 wherein the imaging layer is organic.

8. The method of claim 6 wherein the imaging layer comprises organic photoresist.

9. The method of claim 6 wherein the ion implanting forms innermost bases in the selected regions which are spaced elevationally outward of the layer to be etched by about 50 Angstroms to about 5000 Angstroms.

10. The method of claim 6 wherein the ion implanting forms innermost bases in the selected regions which are spaced elevationally outward of the layer to be etched by about 200 Angstroms to about 2000 Angstroms.

11. The method of claim 6 wherein the ion implanting forms innermost bases in the selected regions which are spaced elevationally outward of the layer to be etched by about 400 Angstroms to about 800 Angstroms.

12. The method of claim 1 wherein the removing further comprises wet solvent processing.

* * * * *